United States Patent [19]
Ries

[11] Patent Number: 5,166,619
[45] Date of Patent: Nov. 24, 1992

[54] GRADIENT COIL ASSEMBLY FOR A MAGNETIC RESONANCE IMAGING APPARATUS

[75] Inventor: Guenter Ries, Erlangen, Fed. Rep. of Germany

[73] Assignee: Siemens Aktiengesellschaft, Munich, Fed. Rep. of Germany

[21] Appl. No.: 619,467

[22] Filed: Nov. 29, 1990

[30] Foreign Application Priority Data

Dec. 11, 1989 [EP] European Pat. Off. ........ 89122835.5

[51] Int. Cl.⁵ ............................................ G01R 33/20
[52] U.S. Cl. ..................................... 324/318; 324/322
[58] Field of Search ............... 324/318, 319, 320, 322; 335/296, 299; 336/232

[56] References Cited

U.S. PATENT DOCUMENTS

| | | | |
|---|---|---|---|
| 4,623,864 | 11/1986 | Inoue et al. | 335/299 |
| 4,728,895 | 3/1988 | Briguet et al. | 324/318 |
| 4,791,370 | 12/1988 | MacKinnon | 324/318 |
| 4,845,432 | 7/1989 | Overweg | 324/320 |
| 4,847,985 | 7/1989 | Aubert | 29/605 |
| 4,992,769 | 2/1991 | Oppelt | 336/232 |

FOREIGN PATENT DOCUMENTS

1107824 5/1961 Fed. Rep. of Germany.
3737133 5/1989 Fed. Rep. of Germany.

OTHER PUBLICATIONS

"Generalised Anderson Coils for Magnetic Resonance Imaging" Momo et al. J. Phys. E: Sci. Instrum. vol. 21, No. 6, (1988) pp. 565–568.

"Gradient Coil Design for a Microscope Imaging of Human Extremities in a One Meter Bore Magnet", Barlov et al., Society of Magnetic Resonance in Medicine, Seventh Annual Meeting and Exhibition (1988) p. 132.

Primary Examiner—Louis Arana
Attorney, Agent, or Firm—Hill, Van Santen, Steadman & Simpson

[57] ABSTRACT

A gradient coil assembly for a magnetic resonance imaging apparatus includes respective gradient coils for the x-gradient and y-gradient which are flat coils provided at the respective planar pole surfaces of the fundamental field magnet. The gradient coils each consist of a number of turns, each turn including a straight conductor element and a return element which proceeds as azimuthally relative to the edge of the coil. The assembly also includes correction coils formed by two identical conductor segments, each segment contain arcuate conductor groups which are provided for correcting the linearity of the gradients in the edge regions of the gradient coils.

7 Claims, 3 Drawing Sheets

GRADIENT COIL ASSEMBLY FOR A MAGNETIC RESONANCE IMAGING APPARATUS

BACKGROUND OF THE INVENTION

1. Field of the Invention

The present invention is directed to a gradient coil assembly for use in a magnetic resonance imaging apparatus for obtaining tomograms of an examination subject, such as a human body whose longitudinal body axis is oriented along the x-axis of a rectangular coordinate system, and whose body region to be examined is situated between the pole pieces of a fundamental field magnet having a fundamental magnetic field which extends in the direction of the z-axis, and in particular to such an assembly wherein gradient coils are in the form of flat coils arranged in respective planes parallel to the pole surfaces.

2. Description of the Prior Art

Magnetic resonance imaging (MRI, or nuclear magnetic resonance (NMR)) tomography devices construct an image from the spatial spin density, or from the distribution of relaxation times, of nuclei in a body under examination. This is accomplished by computational or mensurational analysis of integral proton resonance signals. Many types of tomograms can be produced, and such devices can also be used for joint diagnostics as well as for portraying blood vessel. The examination subject is introduced into a strong, uniform magnetic field, known as the fundamental field, which aligns nuclear spins in the subject. Pulsed gradient coils are provided which generate a number of spatially different gradient magnetic fields for topical resolution in the imaging volume. A radio-frequency antenna excites the nuclear spins, and also receives the resonance signals emitted by the excited nuclei.

It is known to employ superconducting magnets for generating the fundamental field. Such superconducting magnets are used to generate stronger magnetic fields, above approximately 0.5 T, and are in the form of solenoids which generate a static fundamental field proceeding along the longitudinal body axis of the patient. It is also possible to employ pole piece magnets which may be in the form of so-called C-magnets, H-magnets or window frame magnets. If such pole piece magnets are used in a magnetic resonance imaging apparatus, the longitudinal body axis of the patient is oriented in the direction of the x-axis of a rectangular coordinate system. The body region to be examined is situated between the ferromagnetic pole pieces of the magnet, whose magnetic axis extends in the direction z-axis. The pole piece magnet can be excited electromagnetically, or by a permanent magnet, as disclosed in German AS 3,737,133. For homogenizing the fundametal field by correcting for inhomogeneities occurring at the magnet and gradient coil edges, it is known to dispose correction coils in the air gap of an electromagnet, the magnetic field generated by the correction coils being superimposed on the field generated by the electromagnet. The correction coils are usually flat (pancake) coils. The flat coils are arranged immediately in front of the planar pole pieces of the magnet, as described in German AS 1,107,824.

Another embodiment of a magnetic resonance imaging apparatus is described in European application 0,178,216. In this apparatus the body axis of the patient extends in the x-direction and the fundamental magnetic field $B_0$ extends in the z-direction. A special arrangement of pulse gradient coils is provided based on the object of generating an optimally constant gradient in each of the x-direction, the y-direction and the z-direction, with which a topical resolution is achieved for the purpose of imaging. The ideal, linear gradient fields for coils having an infinite expanse on the pole surfaces have the form $$B_z = \begin{matrix} G_x \cdot x \text{ for } x\text{-gradient } G_x \\ G_y \cdot y \text{ for } y\text{-gradient } G_y \\ G_z \cdot z \text{ for } z\text{-gradient } G_z \end{matrix}$$

The coils provided for the z-gradient are in the form of flat solenoids, and arranged on the pole surfaces of the fundamental field magnet. The turns of this coil are connected in series and form groups whose number of turns increases step-by-step with increasing distance from the center of the coil. The current proceeds in opposite directions in the two flat coils. The coils for the x-gradient and y-gradient are each composed of a series circuit of turns which form two conductive layers of conductors parallel to each other on the pole surfaces, and which are permeated by current in same direction. The coils for the y-gradient are disposed 90° relative to the x-gradient coils, so that the x-gradient coils and the y-gradient coils from a system of orthogonal conductors.

SUMMARY OF THE INVENTION

It is an object of the present invention to provide a gradient coil assembly for use in a magnetic resonance imaging apparatus employing a fundamental field magnet wherein the imaging volume is disposed between planar pole surface of the fundamental field magnet, in which the gradient coils for the x-gradient and the y-gradient are in the form of flat coils.

It is a further object of the present invention to provide such a gradient coil assembly which also includes correction coils allocated to the flat coils which eliminate the edge error (inhomogeneity). It is a further object of the present invention to provide such a gradient coil assembly wherein the coil surface of the correction coils is limited to the pole surfaces of the fundamental field magnet. The above objects are achieved in a gradient coil assembly having two gradient coils respectively provided for generating the x-gradient and the y-gradient, each gradient coil being in the form of a flat ("pancake") coil and each being arranged on a pole surface of the fundamental field magnet and being permeated by respective currents in the same direction. Each gradient coil consists of two segments, each segment containing a series circuit of turns and each segment being mirror symmetrically disposed relative to a symmetry plane ($x=0$ for the x-gradient). The turns consist of straight conductor segments arranged parallel to each other at a spacing $A_1$, each of which forms a chord of a circular segment of the gradient coil having an average outside radius $r_0$. Each turn also includes a return proceeding symmetrically relative to a circular arc having the average outside radius $r_0$. The assembly includes respective correction coils allocated to each gradient coil, the correction coils being disposed parallel to the pole surfaces of the fundamental field magnet, and also consisting of two identical segments, each segment containing a series circuit of turns which were mirror-symmetrically arranged relative to a symmetry plane ($x=0$ for the x-gradient), and each segment containing two arcuate conductor groups. An outer conductor group has the average outside radius $r_0$ of the associated gradient coil, and an inner conductor group has a predetermined average radius $r_1$. The conductor groups are electrically connected in series with the associated gradient coil.

In this assembly, edge errors of the x-gradient and the y-gradient, which occur due to the area limitation of the gradient coils, particularly given pulsed gradients, are substantially compensated and edge distortions in the tomogram of the examination subject are thus correspondingly diminished.

DESCRIPTION OF THE PREFERRED EMBODIMENTS

Figure 1:
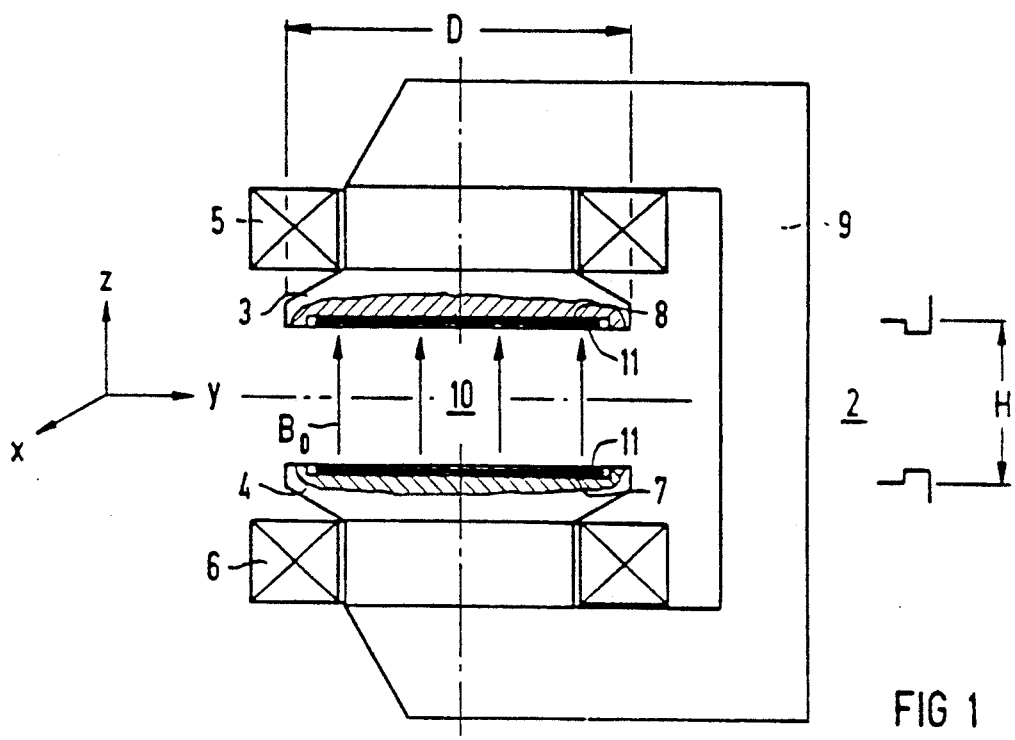
FIG. 1 is a schematic diagram of a magnetic resonance imaging apparatus of the type in which the gradient coil assembly disclosed herein can be used.

FIG. 1 shows a magnetic resonance imaging apparatus which includes a fundamental field magnet 2. In the embodiment of FIG. 1, the fundamental field magnet 2 is a C-magnet, which generates a static, fundamental magnetic field proceeding parallel to the z-axis of a rectangular (x, y, z) coordinate system. The tomography apparatus is suitable for the examination of a human body, with the longitudinal (a.p.) axis of the body being oriented in the direction of x-axis of the coordinate system. The body region to be examined is situated in an imaging volume 10 between the pole pieces 3 and 4 of the fundamental field magnet 2. The pole surfaces of the fundamental field magnet 2 have a diameter of, for example, $D=100$ cm, and are provided with field coils 5 and 6 which generate a fundamental magnetic field $B_0$ proceeding in the direction of the z-axis of the coordinate system in the imaging volume 10. The zero point of the coordinate system (shown outside the imaging volume 10 for clarity) preferably is disposed in the center between the pole surfaces 7 and 8 of the fundamental field magnet 2, so that the z-axis coincides with the rotational axes of the pole pieces 3 and 4. The spacing H of the pole surfaces 7 and 8 may be, for example, 45 cm. The fundamental magnetic field $B_0$ is closed by a magnetic yoke 9. In the practical embodiment of the tomography apparatus, at least the pole surfaces 7 and 8, but preferably the entire poles with the field coils 5 and 6, and the magnetic yoke 9 is also additionally provided with a shielding (not shown) for the radio-frequency field. The shielding may consist of a coating of electrically conductive, non-magnetic metal, preferably copper.

A gradient coil system or assembly 11, which contains gradient coils in the form of flat or "pancake" coils for generating an x-gradient, a y-gradient and a z-gradient, is embedded in a recess, (not shown in detail in FIG. 1) of the pole surfaces 7 and 8. Of these gradient coils, those for generating the x-gradient and the y-gradient are provided with correction coils in accordance with the principles of the present invention. As a result of embedding the flat coils in the recesses of the poles 3 and 4, substantially no additional space requirement in the imaging volume 10 occurs.

Figure 2:
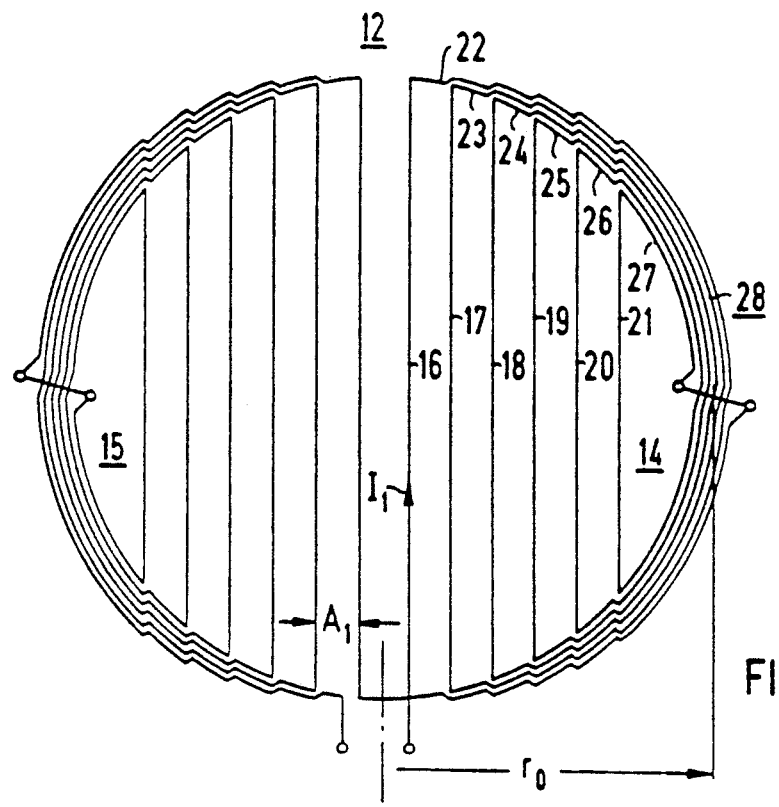
FIG. 2 shows the conductor pattern of a gradient coil for the x-gradient in a gradient coil assembly constructed in accordance with the principles of the present invention.

As shown in FIG. 2, a flat gradient coil 12 in accordance with the principles of the present invention consists of two series-connected segments 14 and 15 arranged mirror-symmetrically relative to the plane $x=0$ as the plane of symmetry. Each of the two segments 14 and 15 consists of a series circuit of windings or turns, each turn consisting of a straight conductor segment and an arcuate return. The straight conductor segments of the turns are respectively arranged at a spacing $A_1$ from each other, for example 5 cm, and are traversed by a current $I_1$. The straight conductor segments are referenced 16 through 21 in FIG. 2.

Each straight conductor segment is connected to the neighboring, parallel straight conductor segment via an arcuate return. The returns are referenced 22 through 27 in FIG. 2. The conductor segments 16 through 21 each form the chord of a circular segment of the flat coil having a means radius of, for example, $r_0=40$ cm. Returns 22 through 27 are arranged side-by-side at the edge of the gradient coil 12, such that they proceed symmetrically relative to the circular arc having the average radius $r_0$, and form a conductor group 28. The two halves 14 and 15 are constructed in the same way, and therefore the other segment 15 need not be described in detail. Given a diameter D of the imaging volume 10 of approximately 40 cm, the relative gradient error $\delta B/B$ at the edge, which arises due to the finite expanse of the gradient coil, is approximately 20%. Unless corrective steps were taken, this would result in unacceptable edge distortions in the creation of the image.

Figure 3:
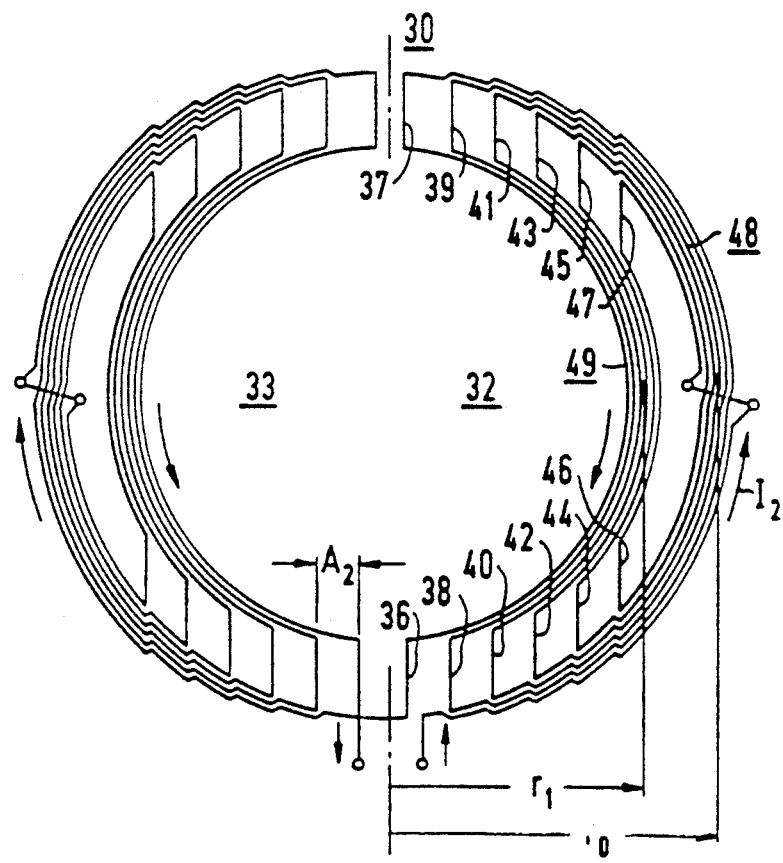
FIG. 3 shows the conductor pattern for a correction coil in the gradient coil assembly constructed in accordance with the principles of the present invention.
Figure 4:
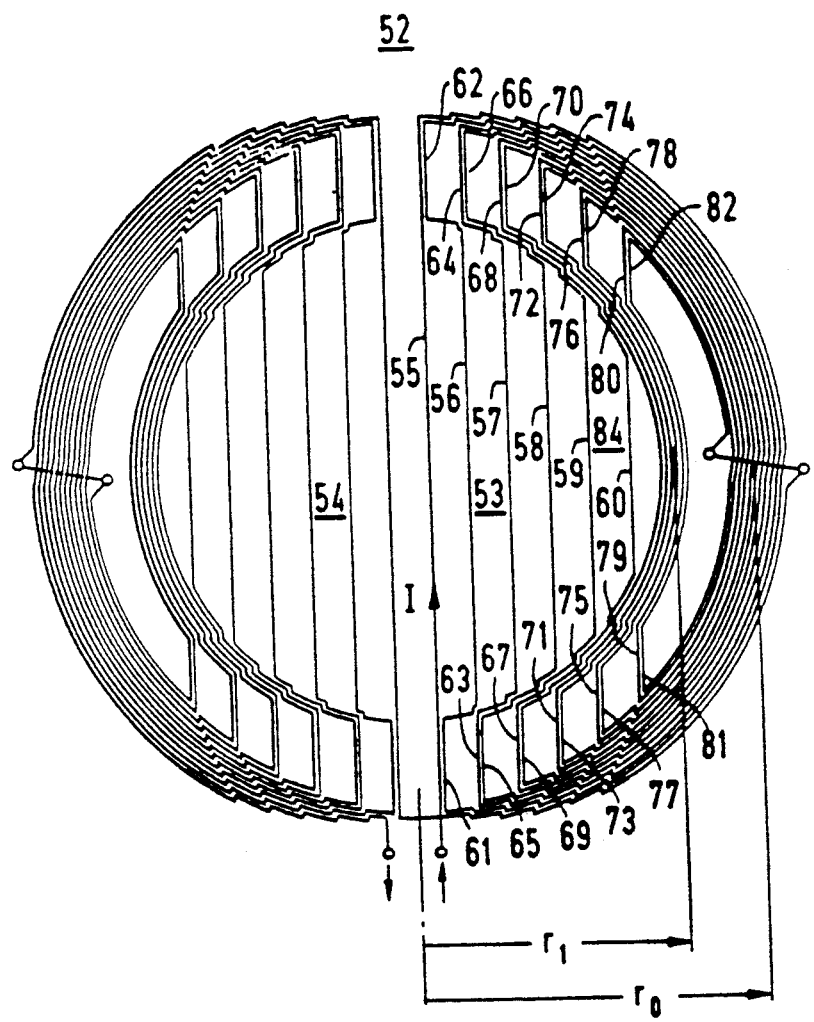
FIG. 4 shows a conductor pattern for the combination of a gradient coil and an allocated correction coil in the gradient coil assembly constructed in accordance with the principles of the present invention.

This field error due to the finite expanse of the coils 14 and 15 is primarily due to the fact that the field in the center plane of the air gap (indicated by a dot-dash line in FIG. 1) is less than the ideal gradient field, but is too high in region of the pole surfaces 7 and 8. Using the correction coil shown in FIG. 3, this error is diminished to a tolerable degree. The correction coil 30 for the x-gradient shown in the embodiment of FIG. 3 has two identical segments 32 and 33, each segment consisting of a series circuit of turns. Each turn contains two straight conductor segments, for example, 36 and 37, which form a part of the chord of a circle. The ends of these straight conductor parts which face away from each other are connected to each other at the coil edge by a substantially arcuate, exterior return having the average radius $r_0$. In the same manner, the ends of the straight conductor parts 36 and 37 facing each other are connected to each other by a substantially arcuate, inner return having the radius $r_1$. The other straight conductor parts are referenced 38 through 47 in FIG. 3. The outer returns form a conductor group 48 having an average radius $r_0$, and the inner returns form a conductor group 49 having an average radius $r_1$. The second segment 33 is constructed in the same way, and is mirror-symmetrically arranged relative to the plane $x=0$. The straight conductor parts 36 through 47 are arranged at a spacing $A_2$ from each other, which may be approximately 5 cm. The turns are permeated by a current $I_2$, indicated by arrows in FIG. 3. For a radius $r_0$ of, for example, approximately 40 cm, the average spacing $r_0-r_1$ of the two conductor groups 48 and 49 will be approximately H/6 (H being the spacing between the pole surfaces 7 and 8, as noted above). For a significantly larger expanse of the gradient coil, with $r_0 >> H$, a limit value of approximately H/9 arises for the average spacing $r_0-r_1$. The combination 52 of a gradient coil with a correction coil is shown in FIG. 4, the combination being a flat coil with segments 53 and 54 which are mirror-symmetrically arranged relative to the plane $x=0$. Each of these segments is constructed in the same way, and contains a gradient coil 12 as shown in FIG. 2 and a correction coil 30 as shown in FIG. 3. This combination includes chord conductors 55 through 60 of the gradient coil and chord ends 61 through 82 of the correction coil. A conductor group formed by the outer returns is referenced 83 and a conductor group formed by the inner returns is referenced 84.

As described above, the function of the correction coil for the x-gradient, for example, according to FIG. 3, is to compensate for deviations in the linearity of the x-gradient which occur in the edge region of the imaging volume 10 because the gradient coil 12 of FIG. 2 does not have an infinite expanse (as is assumed for an ideal gradient) but is physically limited to the diameter of the pole surfaces 7 and 8.

The field of the correction coil 30 is obtained by the superposition of a coil having the radius $r_0$ and a smaller coil having the radius $r_1$, and oppositely directed, but otherwise identical, line currents $I_2$.

The average inside radius $r_1$ of the correction coil 30 of FIG. 3 (and in the combination 52 of FIG. 4) is obtained from the condition $$\left(1 + \frac{I_2 A_1}{I_1 A_2}\right) r_0^2 K_2(k_2 r_0) - \frac{I_2 A_1}{I_1 A_2} r_1^2 K_2(k_2 r_1) = 0.$$

In the above, $K_2$ is the modified Bessel function of the second order and $k_2 = 2\pi/H$. Using the radius $r_0 = 40$ cm as an example, a radius $r_1 = 33.8$ cm is obtained with the simplification $A_1 = A_2 = A$, and $I_1 = I_2 = I$.

In accordance with the principles of the present invention, a gradient coil 12 and a correction coil 30 as respectively shown in FIGS. 2 and 3, or a superposition of the two in a planar combination coil 52 as shown in FIG. 4, are (is) arranged on the upper and lower pole surfaces 7 and 8. The coils on the pole surfaces 7 and 8 are connected in series so that the current has the same direction in all straight, parallel conductor parts 36 through 47, or 55 through 82. Given a radius $r=20$ cm, only a relative gradient error $\delta B/B \leq 3.5\%$ occurs.

The linearity of this x-gradient is adequate. The gradient errors occur on the generated surface of a cylindrical imaging volume 10 between the pole pieces 3 and 4 of FIG. 1 The error is even smaller in an imaging volume in the shape of a sphere of the same radius as is standard in many magnetic resonance imaging devices.

Given a conductor spacing $A=5$ cm, a coil current of $I=(G_x/2 \mu_0)H \cdot A = 89.5$ A is required for a gradient strength $G_x = 10$ mT/m.

For a combination coil as shown in FIG. 4 in the form of a flat coil having an outside radius $r_0 = 40$ cm and having six turns per segment of the gradient coil, the conductor length is approximately 80 meters and the ohmic power amounts to approximately $P_{el} = 1800$ W for the entire system, given a 6 mm² copper conductor ($R = 0.225\Omega$).

Figure 5:
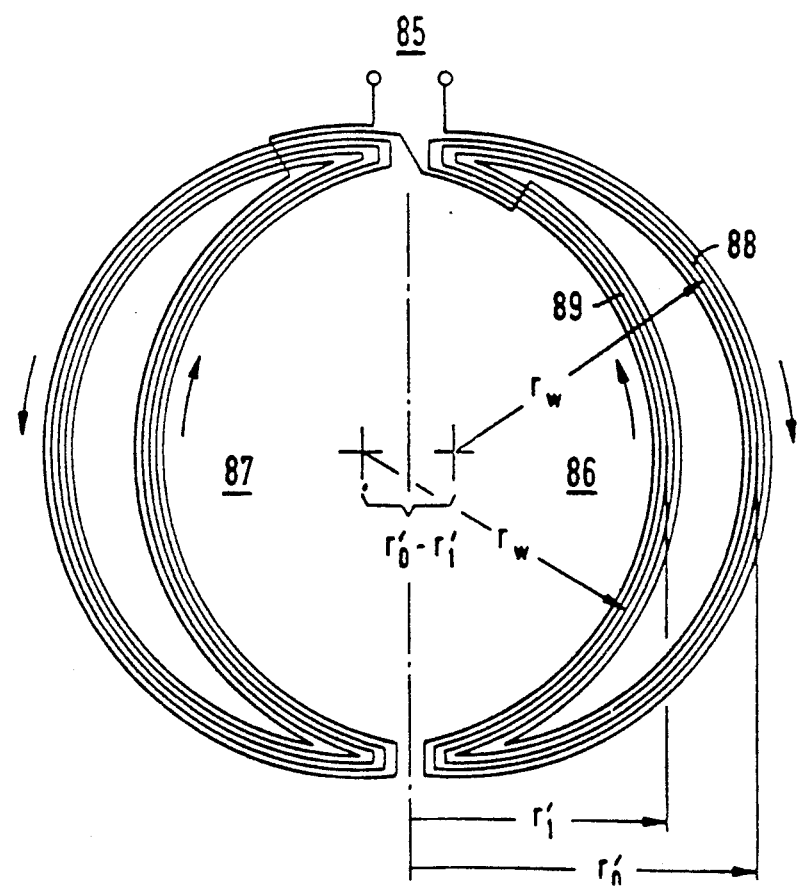
FIG. 5 shows the conductor pattern for a further embodiment of a correction coil in the gradient coil assembly constructed in accordance with the principles of the present invention.

A particularly simple embodiment of a correction coil 85 for the x-gradient is shown in FIG. 5. This embodiment is also in the form of a flat coil having two segments 86 and 87 which are mirror-symmetrically arranged relative to the plane $x=0$, and parallel to one of the pole surfaces 7 or 8. The coil 85 consists of sickle-shaped segments 86 and 87, each of which consisting of a series circuit of turns. Each turn contains two circularly arcuate conductors having the same winding radius $r_w = (r'_0 + r'_1)/2$, but different circle centers, so that arcuate conductor groups 88 and 89, each having the same average winding radius $r_w$ are present, with their circular centers being shifted to the right or left by the amount $(r'_0 - r'_1)/2$ relative to the coordinate origin $x=0$ ($r'_0$ and $r'_1$ are the respective average spacing of the middle portions of the conductor groups 88 and 89 from the symmetry place $x=0$). The combination of conductor groups 88 and 89 forms the sickle-shaped segment 86, and a mirror-symmetric combination forms the sickle-shaped segment 87.

In a preferred embodiment of a magnetic resonance imaging apparatus including a gradient coil assembly as disclosed herein, particularly suited for pulsed gradients, has pole pieces 3 and 4 consisting of silicon-alloyed iron (FeSi), at least in the region of their volume adjoining the pole surfaces 7 and 8. Silicon-iron having a high permeability, such as $\mu_r \geq 4000$, and low electrical conductivity, such as $\rho \geq 0.4 \cdot 10^{-6}$ $\Omega$m, is preferable. In this embodiment, only slight gradient errors due to induced eddy currents in the iron occur, because the eddy currents in the volume over time drop off quickly at the pole surfaces 7 and 8.

Although modifications and changes may be suggested by those skilled in the art, it is the intention of the inventor to embody within the patent warranted hereon all changes and modifications as reasonably and properly come within the scope of their contribution to the art.

I claim as my invention:

1. In a magnetic resonance imaging apparatus for examining a human body having a body axis oriented in the direction of the x-axis of a rectangular coordinate system, said apparatus including a fundamental field magnet having planar pole surfaces which generate a fundamental magnetic field in the direction of the z-axis of said coordinate system, with a region to be examined of said body being situated between said pole surfaces, the improvement of a gradient coil assembly comprising:

a y-gradient coil and a x-gradient coil respectively disposed on and parallel to said pole surfaces, each of said gradient coils being a flat coil and having respective currents flowing therein in the same direction;

each of said gradient coils having an average outside radius and being formed by two gradient coil segments, each gradient coil segment containing a plurality of turns connected in series and said gradient coil segments being disposed mirror-symmetrically relative to a symmetry plane, each turn having a straight conductor part and a return, the respective straight conductor parts of said turns being parallel and spaced from each other by uniform distances and each straight conductor part forming a chord of a circular segment having said average outside radius, and said returns disposed symmetrically relative to a circular arc having said average outside radius; and two correction coils respectively allocated to, and connected in series with, said gradient coils respectively disposed parallel to said pole surfaces, each correction coil being formed by two correction coil segments, each correction coil segment containing a plurality of turns connected in series and said correction coil segments being disposed mirror-symmetrically relative to said symmetry plane, each correction coil segment containing arcuate outer and inner conductor groups, said outer conductor group having said average outside radius, and said inner conductor group having an average inner radius.

2. The improvement of claim 1 wherein each turn of each correction coil is formed by two straight conductor parts each forming a part of a chord of said circular segment having said average outside radius, each straight conductor part having an outer end and an inner end, the outer ends of the two straight conductor parts in each turn facing away from each other and being connected via an arcuate conductor in said outer arcuate conductor group having said average outside radius, and the inner ends of the two conductor parts in a turn facing toward each other and being connected by an arcuate conductor in said inner conductor group having said average inner radius.

3. The improvement of claim 2 wherein said average outside radius is $r_0$ and said average inner radius is $r_1$, and wherein $r_1$ satisfies the following relationship:

$$\left(1 + \frac{I_2 A_1}{I_1 A_2}\right) r_0^2 K_2(k_2 r_0) - \frac{I_2 A_1}{I_1 A_2} r_1^2 K_2(k_2 r_1) = 0.$$

wherein $I_1$ is the current in said gradient coil, $I_2$ is the current in said correction coil, $A_1$ is said uniform spacing distance between the straight conductor parts of said gradient coils, $A_2$ is the spacing distance between respective straight conductor parts of said correction coils, $K_2$ is a modified Bessel function of the second order, $k_2$ is $2\pi/H$, and H is the spacing between the pole surfaces.

4. The improvement of claim 1 wherein each of said gradient coils and its associated correction coil are combined in a single combination coil which is a flat coil.

5. The improvement of claim 1 wherein said arcuate outer conductor group of each correction coil is an outer circularly arcuate conductor group and wherein said arcuate inner conductor group of each correction coil is an inner circularly arcuate conductor group, said outer circularly arcuate conductor group being centered on a first circle center and having a winding radius relative thereto, said inner circularly arcuate conductor group being centered on a second circle center and having the same winding radius relative thereto, said outer circularly arcuate conductor group having a middle arc portion disposed at an average spacing $r'_0$ from said symmetry plane and said inner circularly arcuate conductor group having a middle arc portion disposed at an average spacing $r'_1$ from said symmetry plane, said first and second circle centers being respectively disposed on opposite sides of said symmetry plane each at a distance $(r'_0 - r'_1)/2$ therefrom, so that each correction coil has a sickle shape formed in combination by said inner and outer circularly arcuate conductor groups.

6. The improvement of claim 1 wherein said fundamental field magnet has pole pieces on which said pole surfaces are disposed, said pole pieces consisting, at least in the region of said pole surfaces, of iron having high permeability and low electrical conductivity.

7. The improvement of claim 6 wherein said pole pieces at least in the region of said pole surfaces consist of silicon-alloyed iron.

* * * * *